US007449882B2

(12) United States Patent
Witcraft et al.

(10) Patent No.: US 7,449,882 B2
(45) Date of Patent: *Nov. 11, 2008

(54) INTEGRATED SET/RESET DRIVER AND MAGNETO-RESISTIVE SENSOR

(75) Inventors: William F. Witcraft, Minneapolis, MN (US); Mark D. Amundson, Cambridge, MN (US)

(73) Assignee: Honeywell International Inc., Morristown, NJ (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/782,455

(22) Filed: Jul. 24, 2007

(65) Prior Publication Data

US 2007/0262773 A1    Nov. 15, 2007

Related U.S. Application Data

(63) Continuation of application No. 10/754,945, filed on Jan. 8, 2004, now Pat. No. 7,265,543.

(51) Int. Cl.
*G01R 33/02* (2006.01)

(52) U.S. Cl. .................................. 324/252; 324/207.21
(58) Field of Classification Search ............ 324/207.21, 324/249, 252; 257/425; 338/32 R, 32 H
See application file for complete search history.

(56) References Cited

U.S. PATENT DOCUMENTS

| 4,760,285 | A | * | 7/1988 | Nelson | 327/511 |
|---|---|---|---|---|---|
| 4,847,584 | A | | 7/1989 | Pant | 338/32 R |
| 5,247,278 | A | | 9/1993 | Pant et al. | 338/32 R |
| 5,521,501 | A | | 5/1996 | Dettmann et al. | 324/252 |
| 5,820,924 | A | | 10/1998 | Witcraft et al. | 427/130 |
| 5,940,319 | A | | 8/1999 | Durlam et al. | 365/171 |
| 6,219,273 | B1 | | 4/2001 | Katti et al. | 365/158 |
| 6,252,390 | B1 | | 6/2001 | Black, Jr. et al. | 324/127 |

(Continued)

FOREIGN PATENT DOCUMENTS

DE    34 26 785    1/1986

(Continued)

OTHER PUBLICATIONS

Geppert, Linda, "The New Indelible Memories: It's a Three-Way Race in the Multibillion-Dollar Memory Sweepstakes," IEEE Spectrum, Mar. 2003.

(Continued)

*Primary Examiner*—Bot LeDynh

(57) ABSTRACT

A magnetic-sensing apparatus and methods of making and using thereof are disclosed. The sensing apparatus may have one or more magneto-resistive-sensing elements, one or more reorientation elements for adjusting the magneto-resistive-sensing elements, and semiconductor circuitry having driver circuitry for controlling the reorientation elements. The magneto-resistive-sensing elements, reorientation elements and/or semiconductor circuitry may be disposed in single package and/or monolithically formed on a single chip. Alternatively, some of the semiconductor circuitry may be monolithically formed on a first chip with the magneto-resistive-sensing elements, while a second portion of the semiconductor circuitry may be formed on a second chip. The first and second chips may be placed in close proximity and electrically connected together. Alternatively the chips may have no intentional electrical interaction. Exemplary semiconductor devices that might be implemented include, without limitation, capacitors, inductors, operational amplifiers, set/reset circuitry for the MR sensors, accelerometers, pressure sensors, position-sensing circuitry, compassing circuitry, etc.

15 Claims, 6 Drawing Sheets

U.S. PATENT DOCUMENTS

| | | | |
|---|---|---|---|
| 6,331,924 B1 | 12/2001 | Takada | 360/323 |
| 6,461,914 B1 | 10/2002 | Roberts et al. | 438/253 |
| 6,462,983 B2 | 10/2002 | Katti et al. | 365/171 |
| 2002/0021580 A1 | 2/2002 | Katti et al. | 365/158 |
| 2002/0083605 A1 | 7/2002 | Blank et al. | 33/356 |
| 2002/0153551 A1 | 10/2002 | Wong et al. | 257/303 |
| 2003/0016011 A1 | 1/2003 | Witcraft et al. | 324/252 |
| 2003/0042900 A1 | 3/2003 | Witcraft et al. | 324/252 |
| 2003/0042901 A1 | 3/2003 | Witcraft et al. | 324/252 |
| 2003/0117208 A1* | 6/2003 | Bicking | 327/513 |
| 2004/0137275 A1 | 7/2004 | Jander et al. | 428/692 |

FOREIGN PATENT DOCUMENTS

| | | | |
|---|---|---|---|
| EP | 0 544 479 B1 | 3/1999 | |
| EP | 1 124 271 | 8/2001 | |
| FR | 2 830 621 | 4/2003 | |

OTHER PUBLICATIONS

"Magnetic Sensor Products HMC/HMR Series," Honeywell International Inc., Oct. 1996.

"Honeywell Magnetic Sensors Product Catalog," Honeywell International Inc., May 2003.

"1-and 2-Axis magnetic Sensors HMC1001/1002: HMC1021-1022," Honeywell International Inc., Apr. 2000.

"Magnetic Sensors, Frequently Asked Questions" printed from the World Wide Web at http://www.ssec.honeywell/magnetic/faq.htm on May 6, 2003.

International Search Report for PCT/US2004/017392 dated Nov. 10, 2004.

* cited by examiner

INTEGRATED SET/RESET DRIVER AND MAGNETO-RESISTIVE SENSOR

RELATED APPLICATIONS

This Application is a continuation application of U.S. application Ser. No. 10/754,945. Accordingly, this Application claims priority to U.S. application Ser. No. 10/754,945. U.S. application Ser. No. 10/754,945, filed Jan. 8, 2004, now U.S. Pat. No. 7,265,543 issued Sep. 4, 2007 is hereby incorporated by reference.

U.S. application Ser. No. 10/754,945 claims the benefit of U.S. Provisional Application Nos. (1) 60/475,175, filed Jun, 2, 2003, entitled "On-Die Set/Reset Driver for a Magneto-Resistive Sensor," naming as inventors Mark D. Amundson and William F. Witcraft; (2) 60/475,191, filed Jun. 2, 2003, entitled "Semiconductor Device Integration with a Magneto-Resistive Sensor," naming as inventors Lonny L. Berg and William F. Witcraft; and (3) 60/462,872, filed Apr. 15, 2003, entitled "Integrated GPS Receiver and Magneto-Resistive Sensor Device," naming as inventors William F. Witcraft, Hong Wan, Cheisan J. Yue, and Tamara K. Bratland. U.S. application Ser. No. 10/754,945 and the present application also incorporates each of these Provisional Applications in their entirety by reference herein U.S. application Ser. No. 10/754,945 and the present application are related to and incorporate by reference U.S. Non-provisional Application Nos. (1) 10/754,946, filed concurrently, entitled "Semiconductor Device Integration with a Magneto-Resistive Sensor," naming as inventors Lonny L. Berg and William F. Witcraft; and (2) 10/754,947, filed concurrently, entitled "Integrated GPS Receiver and Magneto-Resistive Sensor Device," naming as inventors William F. Witcraft, Hong Wan, Cheisan J. Yue, and Tamara K. Bratland.

BACKGROUND

1. Field

The present invention relates in general to magnetic field and current sensors, and more particularly, without limitation, to signal processing for magneto-resistive sensors.

2. Related Art

Magnetic field sensors have applications in magnetic compassing, ferrous metal detection, and current sensing. They may detect magnetic field variations in machine components, the earth's magnetic fields, underground minerals, or electrical devices and lines.

In magnetic sensors, specifically Anisotropic Magneto-Resistive (AMR) bridge sensors, a thin film of magneto-resistive material is placed on a silicon substrate to precisely measure the intensity and/or direction of local magnetic fields. Since the deposition of thin films on silicon substrates can utilize the processes of a semiconductor foundry for fabrication, further steps to create adjacent semiconductor circuit elements can be added. These semiconductor circuit elements traditionally have not been co-located on the same substrate as magneto-resistive sensors due to the incompatibility of sensor thin-films with traditional semiconductor manufacturing processes.

Typically, magneto-resistive sensors use Permalloy, a ferromagnetic alloy containing nickel and iron, as the magneto-resistive material. Often, the Permalloy is arranged in thin strips of Permalloy film. When a current is run through an individual strip, the magnetization direction of the strip may form an angle with the direction of current flow. As the magnetization direction changes, the effective resistance of the strip changes. Particularly, a magnetization direction parallel to the current flow direction results in maximum resistance through the strip and a magnetization direction perpendicular to the current flow direction results in minimum resistance through the strip. This changed resistance may cause a change in voltage drop across the strip when a current is run through the strip. This change in voltage may be measured as an indication of change in the magnetization direction of external magnetic fields acting on the strip.

To form the magnetic field sensing structure of a magneto-resistive sensor, several Permalloy strips may be electrically connected together. The Permalloy strips may be placed on the substrate of the magneto-resistive sensor as a continuous resistor in a "herringbone" pattern or as a linear strip of magneto-resistive material, with conductors across the strip at an angle of 45 degrees to the long axis of the strip. This latter configuration is known as "barber-pole biasing." It may force the current in a strip to flow at a 45-degree angle to the long axis of the strip, because of the configuration of the conductors. These sensing structure designs are discussed in U.S. Pat. No. 4,847,584, Jul. 11, 1989, to Bharat B. Pant and assigned to the same assignee as the current application. U.S. Pat. No. 4,847,584 is hereby fully incorporated by reference. Additional patents and patent applications describing magnetic sensor technologies are set forth below, in conjunction with the discussion of FIG. 2.

Magnetic sensors often include a number of re-orientation elements or "straps" through which current may be run, for controlling and adjusting the sensing characteristics. For example, magnetic sensor designs often include set/reset and/or offset re-orientation elements or "straps" (hereinafter "set/reset straps" and "offset straps").

Offset straps serve to cancel or correct for external magnetic fields. Set/reset straps help to re-orient the magneto-resistive thin film grain structure for best measurement accuracy. This process of re-orienting magneto-resistive films utilizes the set/reset strap metallization to apply brief, intense magnetic field strengths to force arbitrarily orientated thin film grains substantially into a single direction. This brief field application "sets" the film into one orientation. A second brief field application in a similarly intense but opposite direction "resets" the film's grain orientation. Repeated set and/or reset fields are used to ensure film granules remain undisturbed and in a relatively known magnetic orientation.

While the set/reset straps themselves have typically been located on-chip, driver circuitry for these straps has typically been located off-chip, resulting in space inefficiencies. Off-chip solutions typically pulse a current through one or more straps (typically metal) over the magneto-resistive sensor bridge, but external board-level circuitry is used to switch and generate the current pulse.

Similarly, other components, such as operational amplifiers, transistors, capacitors, etc., have typically been implemented on a separate chip from the magnetic sensor. For example, signal conditioning and electrostatic discharge circuitry is typically located off-chip. While this may be fine for some applications, for others, in which physical space is at a premium, it would be desirable to have one or more of these semiconductor components as part of the same chip as the magnetic sensor. Thus, a single-chip design, and in particular, a design having set/reset driver circuitry located on-chip, would be desirable.

SUMMARY

A magnetic-sensing apparatus and methods of making and using thereof are disclosed. The sensing apparatus may include one or more magneto-resistive-sensing elements for detecting or otherwise measuring magnetic fields, one or more reorientation elements for adjusting the magneto-resistive sensing elements, and semiconductor circuitry having driver circuitry for controlling or driving the reorientation elements. Some or all of the magneto-resistance-sensing elements, reorientation elements, and the semiconductor circuitry may all be disposed in a single package and/or monolithically formed on a single chip.

BRIEF DESCRIPTION OF THE DRAWINGS

Preferred embodiments of the present inventions are described with reference to the following drawings wherein like reference numerals refer to like elements in the various figures, and wherein.

DETAILED DESCRIPTION

In view of the wide variety of embodiments to which the principles of the present invention can be applied, it should be understood that the illustrated embodiments are exemplary only, and should not be taken as limiting the scope of the present invention.

Exemplary Architecture

Figure 1:
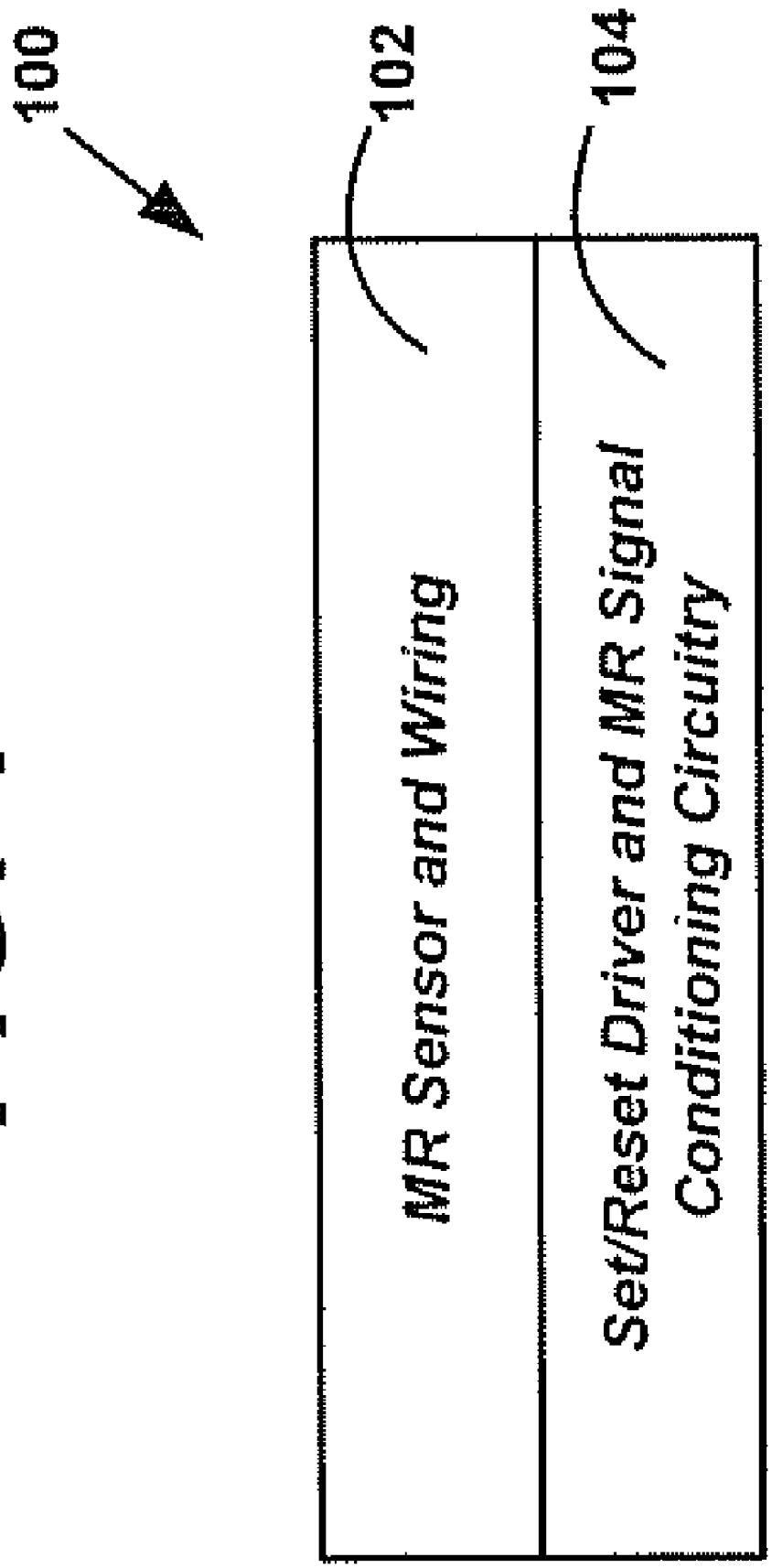
FIG. 1 is a simplified block diagrams illustrating integration of one or more semiconductor device components with a magneto-resistive sensor in accordance with an exemplary embodiment.

FIG. 1 is a simplified block diagram illustrating integration of one or more semiconductor device components with one or more magneto-resistive sensing elements, in accordance with an embodiment. In general, the terms integration or integrated can mean that one or more subsystems are included in a larger system. Integral, on the other hand, can mean that the subsystems, architecture and functions thereof are commingled with other parts of a larger system. Except where indicated, throughout this description the terms integral and integrated are interchangeably used to describe a composite assembly in accordance with either or both definitions.

The device 100 includes first and second portions 102, 104. The first portion 102 may include magneto-resistive-sensing elements (hereinafter collectively referred to as "MR sensor") and wiring, such as thin-film traces. The second portion 104 may include one or more semiconductor device components, such as set/reset driver circuitry. In a preferred embodiment, the second portion 104 also includes signal conditioning circuitry and circuitry for ESD (Electro-Static Discharge) protection for the MR sensor in the first portion 102. As discussed below, the second portion 104 is particularly amenable to standard semiconductor fabrication techniques, such as those used for CMOS (Complementary Metal Oxide Semiconductor).

The first and second portions 102, 104 may be disposed within the same chip, so that the device 100 is a discrete, one-chip or monolithic design. Prior attempts to integrate semiconductor devices with MR sensors have typically involved at least two die, placed separately on a printed circuit board, which likely results in a larger-sized end-user device (e.g. cell phone, portable device, watch, automotive sensor, etc.) and increased complexity. The one-chip design of device 100 provides reduced size and added functionality.

The first and second portions 102, 104 may be manufactured using standard RF/microwave processes, such as CMOS, Bipolar, BiCMOS, GaAs (Gallium Arsenide), and InP (Indium Phosphide), for example. While a technology like GaAs may provide advantages in operational speed, reduced power consumption might best be realized through the use of other techniques, such as those involving SOI (Silicon on Insulator) or MOI (Microwave-On-Insulator), a variation of SOI. In one embodiment, SOI 0.35µ processing is used.

In a preferred embodiment, the first portion 102 is manufactured using standard lithography, metallization, and etch processes, such as those set forth in the list of patents incorporated by reference below. Other techniques for manufacturing the MR sensor may also be used, however. The second portion 104 is preferably manufactured using SOI 0.35µ processing, or another RF/microwave method, such as GaAs processing.

Integrating the MR sensor with the one or more semiconductor device components may be accomplished in one of at least two ways. In a first embodiment, the MR sensor can be fabricated on the same die as the semiconductor device components, and may include other circuitry, such as signal conditioning and ESD protection circuitry. In a second embodiment, the MR sensor is fabricated on a first die, while at least some of the semiconductor device components are fabricated on a second die.

The first and second die may then be placed in close proximity to one another and may be packaged within a single integrated circuit chip. In either case, it may be advantageous to include one or more connections between the semiconductor device components and the MR sensor depending on the particular application. For example, such connections could provide feedback. Alternatively, the semiconductor device components and MR sensor may be simply physically close to one another, but with no intentional electrical interaction.

Because conventional semiconductor processing techniques may be used, the particular semiconductor device circuitry is not disclosed herein, as it is flexible. Thus, conventional semiconductor designs implementable in CMOS/Bipolar/BiCMOS, can be utilized in accordance with the presently disclosed embodiments. Exemplary semiconductor devices that might be implemented include, without limitation, capacitors, inductors, operational amplifiers, set/reset circuitry for the MR sensors, accelerometers, pressure sensors, position-sensing circuitry, compassing circuitry, etc.

Some semiconductor device components may generate electromagnetic fields significant enough to influence operation of the MR sensor. Thus, the sensitive parts of the MR sensor portion 102 of the integrated device 100 may need to be physically separated from parts of the semiconductor device portion 104 in order to provide optimal sensor operation. The amount of separation may be determined using theoretical or empirical means, for example. As an alternative to introducing a physical separation between potentially interfering parts of the integrated device 100, a shielding layer may be provided, as described in U.S. Provisional Patent Application No. 60/475191.

Exemplary Fabrication Techniques

Figure 2:
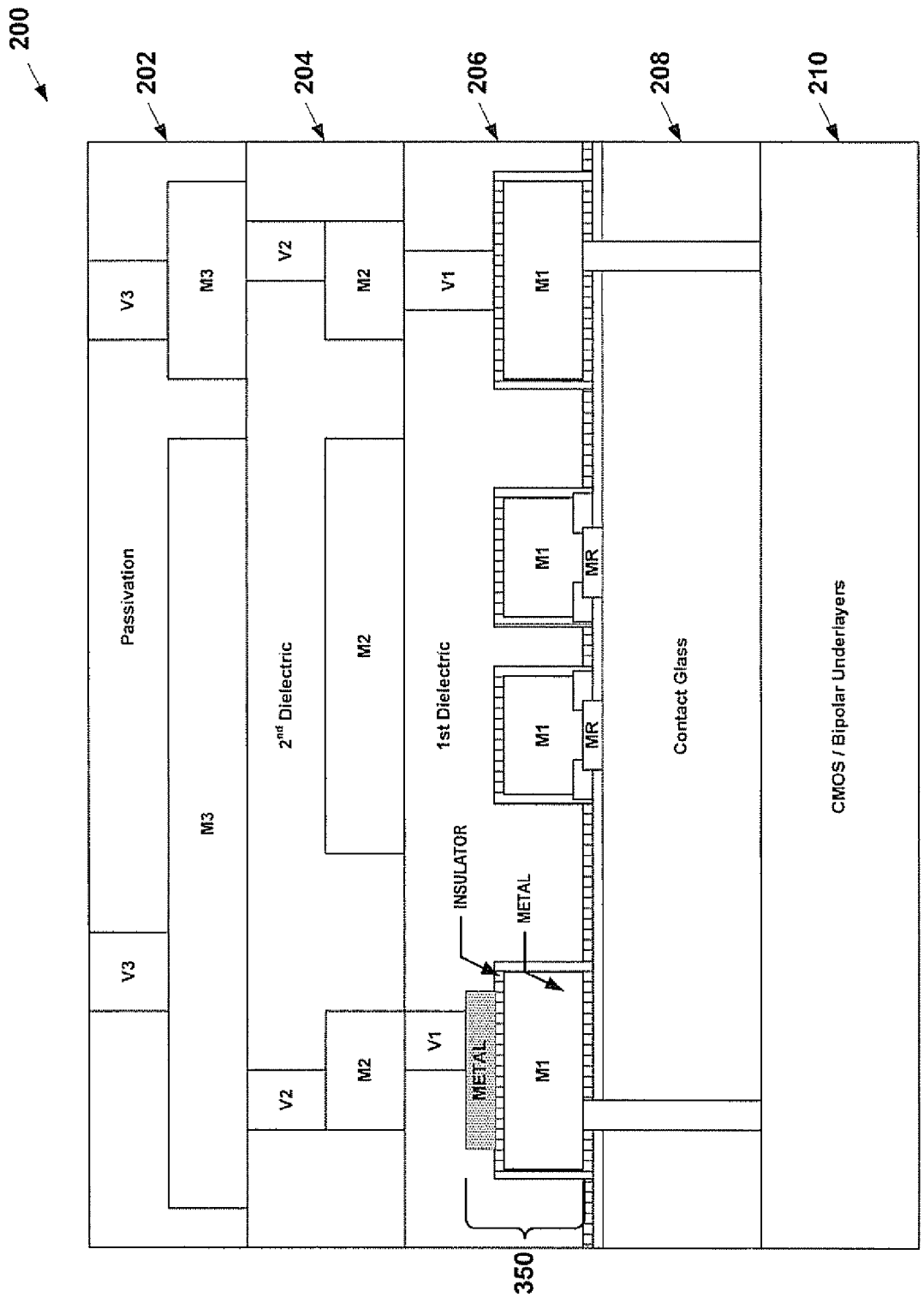
FIG. 2 is a diagram illustrating magneto-resistive sensor having integrated set/reset driver circuitry in accordance with an exemplary embodiment.

FIG. 2 illustrates an exemplary cross section of a device 200, in which one or more semiconductor components, such as those for use with set/reset driver circuitry, may be implemented with a MR sensor. For purposes of this example, CMOS/Bipolar semiconductor technologies will be assumed. The semiconductor device components (including any signal conditioning circuitry and drivers for set and/or offset straps associated with the MR sensor portion) may be fabricated largely within CMOS/Bipolar underlayers 210, while the MR sensor may be fabricated in the layers 202-206 above the contact glass layer 208. Also shown in FIG. 2 are various contacts V1-V3 and metallizations M1-M3, and NiFe Permalloy structures (see the 1st dielectric layer 206). Besides the underlayers 210, the contact glass layer 208, and the 1st dielectric layer, 206, also shown are a second dielectric layer 204, and a passivation layer 202.

In one embodiment, layers 202-206 are formed using standard lithography, metallization, and etch processes, while layers 208-210 are formed using SOI 0.35μ processing, or another RF/microwave method, such as GaAs processing. Other components of the MR sensor (such as set, reset, and offset straps; signal conditioning circuitry, and ESD protection circuitry) may be included in various locations in the layers 206-210, and are not fully illustrated in FIG. 2.

Exemplary Magneto-Resistive Designs

For further information on MR sensor designs, reference may be made to the following Honeywell patents and/or patent applications, all of which are incorporated by reference herein:

U.S. Pat. No. 6,529,114, Bohlinger et al., "Magnetic Field Sensing Device";

U.S. Pat. No. 6,232,776, Pant et al., "Magnetic Field Sensor for Isotropically Sensing an Incident Magnetic Field in a Sensor Plane";

U.S. Pat. No. 5,952,825, Wan, "Magnetic Field Sensing Device Having Integral Coils for Producing Magnetic Fields";

U.S. Pat. No. 5,820,924, Witcraft et al., "Method of Fabricating a Magnetoresistive Sensor";

U.S. Pat. No. 5,247,278, Pant et al., "Magnetic Field Sensing Device";

U.S. patent application Ser. No. 09/947,733, Witcraft et al., "Method and System for Improving the Efficiency of the Set and Offset Straps on a Magnetic Sensor"; and U.S. patent application Ser. No. 10/002,454, Wan et al., "360-Degree Rotary Position Sensor."

In addition, U.S. Pat. No. 5,521,501, to Dettmann et al., titled "Magnetic field sensor constructed from a remagnetization line and one magnetoresistive resistor or a plurality of magnetoresistive resistors" is also incorporated herein by reference, and may provide additional details on constructing a MR sensor.

Exemplary Metal-Insulator-Metal Capacitor Integration

To provide the functionality of the set/reset driver circuitry, the device 200 of FIG. 2 may include a number of semiconductor device components. In addition, one or more specialized capacitors, such as the Metal-Insulator-Metal (MIM) capacitor 350 shown in the first dielectric layer 206 may be included. As shown, the MIM capacitor 350 is located between the contact V1 and a nitride layer overlaying low-resistivity metallization M1. While the MIM capacitor 350 is shown located in the first dielectric layer 206, it could alternatively be in other locations, such as in the passivation layer 202, second dielectric layer 204, or in the CMOS/Bipolar underlayers 210. The integrated MIM capacitor is an improvement over the linear capacitors utilized with prior MR sensors due to its reduced size, possibly resulting in a smaller overall package.

The device 200 is a preferred architecture for a MR sensor, and other architectures, having different Permalloy placements and structures could be used instead. In yet another embodiment, the MIM capacitor 350 could be included in the device 200, and the CMOS/Bipolar underlayers 210 could be omitted or replaced with some other base or substrate material.

Integrated or Integral Set/Reset Circuitry

Figure 3:
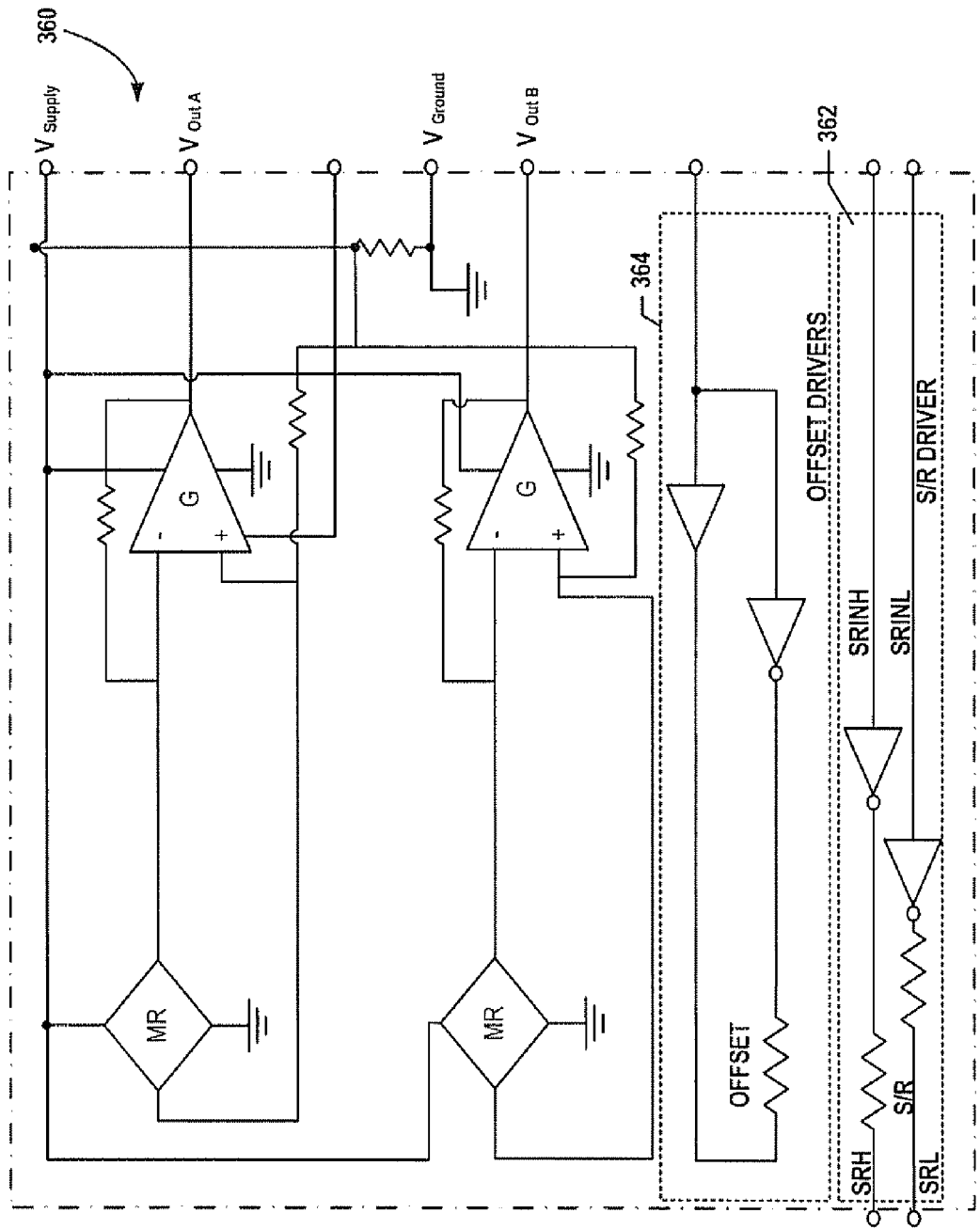
FIG. 3 is a schematic diagram illustrating set/reset circuitry that may be implemented on-die with a magneto-resistive sensor in accordance with an exemplary embodiment.

FIG. 3 is a schematic diagram illustrating exemplary set/reset circuitry 360, 362 that may be implemented on-die or monolithically with a MR sensor in accordance with an exemplary embodiment. The circuit designs shown in FIG. 3 are just a couple of many possible designs and are not intended to be limiting in any way.

Exemplary circuit 360 is an amplification circuit to increase the signal gain of the MR sensor. Two operational amplifiers with negative feedback loops provide a differential voltage signal indicative of the change in a local magnetic field, as sensed across the legs of the magneto-resistive bridge. The resistor values shown are particularly suited to a preferred embodiment, and other resistor values and configurations may be more appropriate for other MR sensor designs. Similarly, while two operational amplifiers are shown for circuit 360, other designs may utilize more or fewer operational amplifiers, and may involve more or fewer bias resistors.

Exemplary circuit 362 is switching circuitry to generate set/reset current pulses through the set/reset straps, to appropriately orient the thin film magnetic domains of the bridge circuit in an appropriate direction. Circuit 362 includes a complementary pair of field-effect transistors switched by ESDR relays to provide the set/reset pulses. Like circuit 360, design choices for particular magneto-resistor sensors may call for variations in the switching circuitry. The resistor values shown are specific to a preferred embodiment.

Circuit 364 is entirely optional and may be used for testing purposes. It illustrates the flexibility in that many application-specific features can be included in the set/reset driver circuit without departing from the intended scope of the invention. For all circuitry shown in FIG. 3, various modifications may be made. For example, thermal or temperature compensation circuitry may be included to prevent thermal drift.

Exemplary Semiconductor Circuitry Integration

Figure 4:
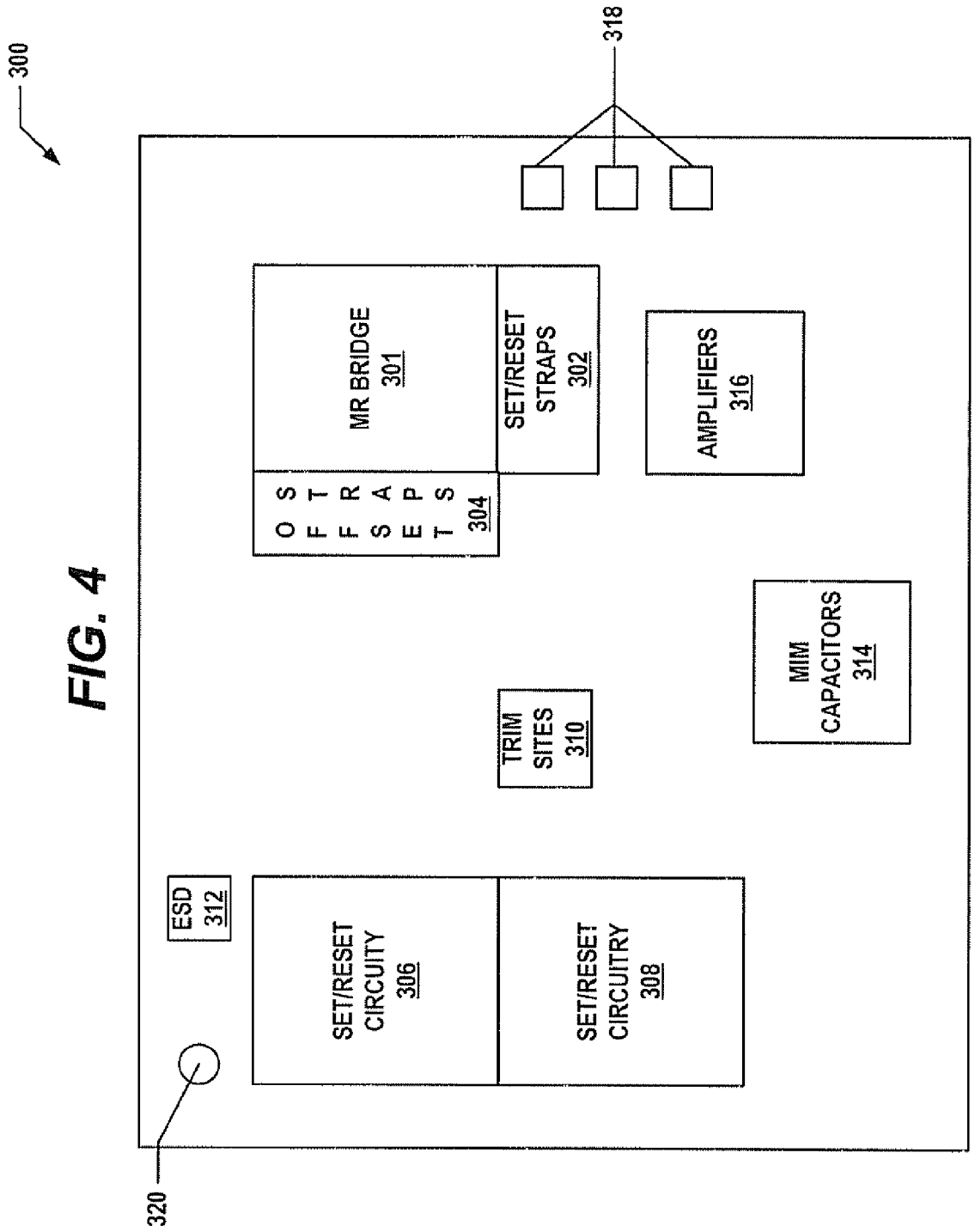
FIG. 4 is a plan view of a magneto-resistive sensor with semiconductor components in accordance with an exemplary embodiment.

FIG. 4 is a plan view of one embodiment of a device 300 in which set/reset driver circuitry is integrated on-chip or monolithically with a MR sensor. Exemplary parts of the device 300 include a magneto-resistive bridge 301, set/reset straps 302, offset straps 304, set/reset circuitry 306-308, laser trim sites 310 (for matching impedance of the legs of the bridge 301), ESD protection diode 312, MIM capacitors 314, operational amplifiers 316, contacts 318, and test sites 320. Reference may be made to the patents and patent applications incorporated above for further information.

Figure 5:
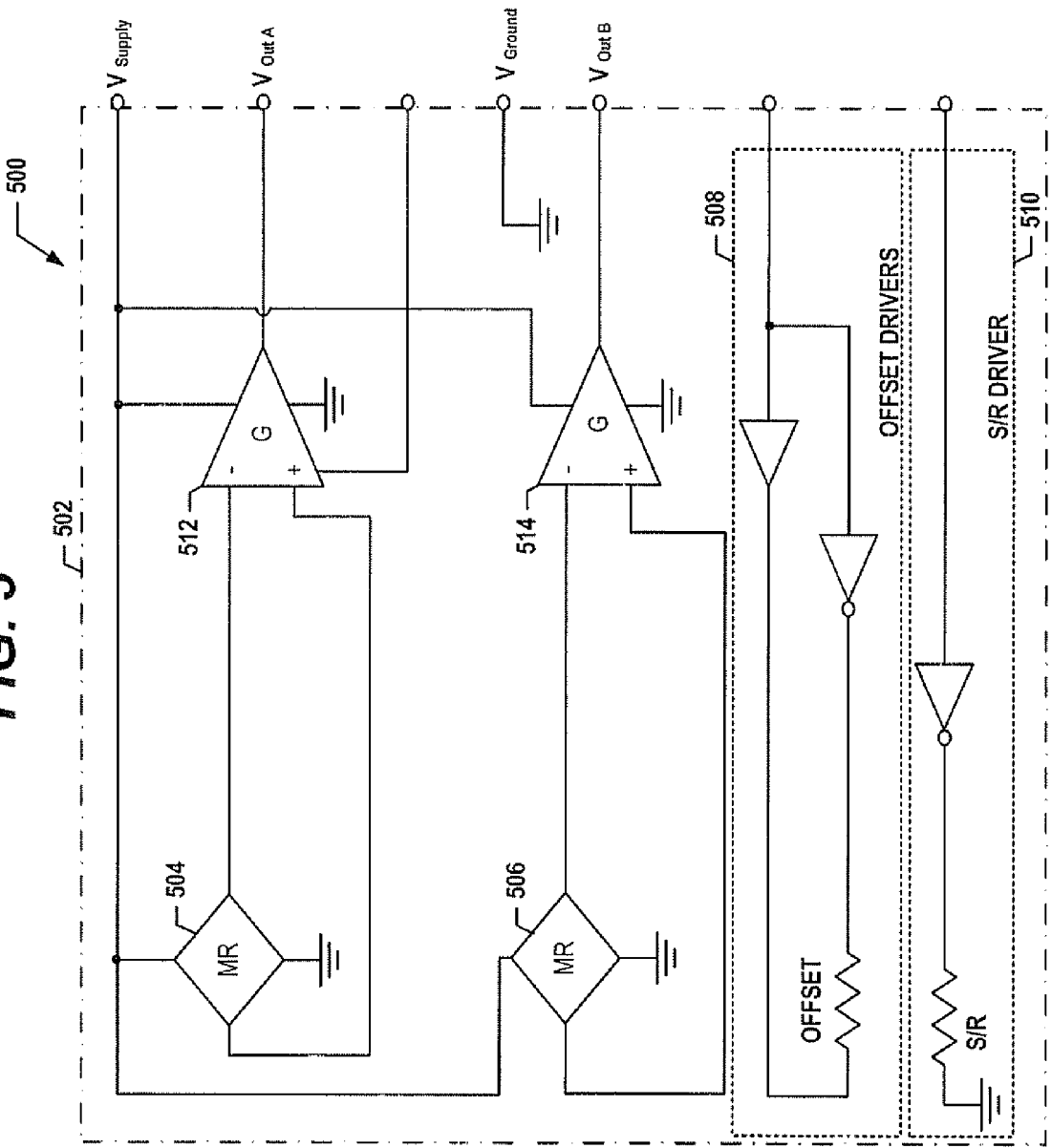
FIG. 5 is a first simplified circuit diagram illustrating a first compassing circuit integrated with a magneto-resistive sensor in accordance with an exemplary embodiment.
Figure 6:
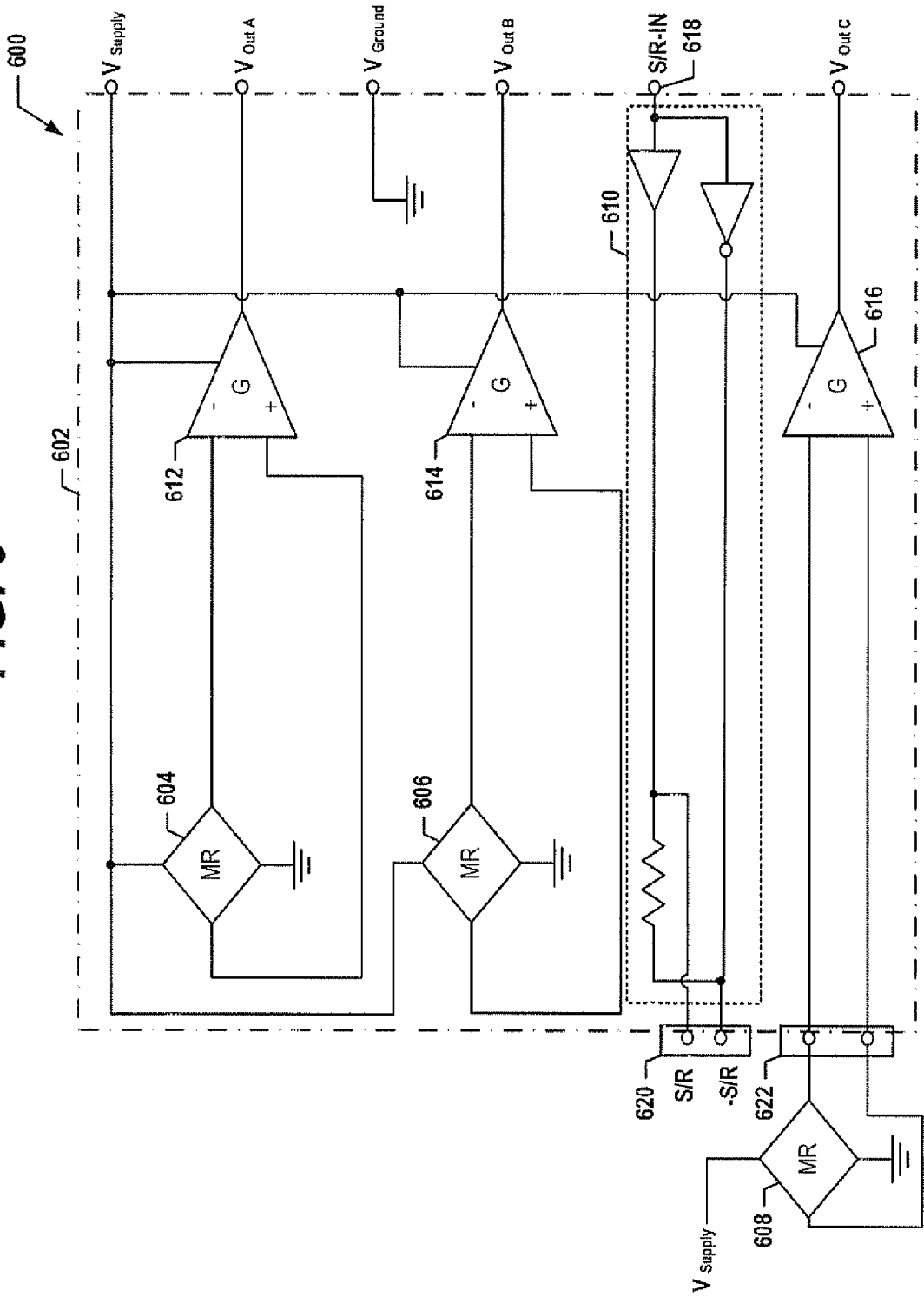
FIG. 6 is a second simplified circuit diagram illustrating a second compassing circuit integrated with a magneto-resistive sensor in accordance with an exemplary embodiment.

FIGS. 5-6 are simplified circuit diagrams 500-600 illustrating examples of the types of semiconductor circuitry that may be integrated with a MR sensor. These exemplary diagrams are not intended to be an exhausting or inflexible list of circuitry that may be integrated with or integral to the MR sensor, but rather to illustrate the breadth of circuitry that may be so combined.

FIG. 5 is a simplified circuit diagram 500 illustrating a compassing circuit 502 integrated with the MR sensor. In this embodiment, the MR sensor may be formed from first and second magneto-resistive-sensing elements 504, 506. The first and second magneto-resistive-sensing elements 504, 506 may sense orthogonal magnetic fields and responsively provide first and second outputs. In a three-dimensional coordinate system, for example, the first magneto-resistive-sensing element 504 may sense magnetic fields in the "X" direction, whereas the second magneto-resistive-sensing element 506 may sense magnetic fields in the "Y" direction. The X-Y planes, of course, may rotate through the coordinate system.

One or more re-orientation elements, in the form of set/reset and/or offset straps (not shown), may be formed over or otherwise integrated with the first and second magneto-resistive-sensing elements 504, 506. As noted above, these re-orientation elements can be used to control and adjusting the sensing characteristics of the first and second magneto-resistive-sensing elements 504, 506.

The compassing circuit 502 may include (i) offset-strap-driver circuitry 508 for effectuating offset adjustment of the first and/or second magneto-resistive-sensing elements 504, 506; (ii) set/reset-strap-driver circuitry 510 for effectuating set/reset sequencing of the first and/or second magneto-resistive-sensing elements 504, 506; (iii) and first and second difference amplifiers 512, 514 for functionally adjusting the outputs of the first and second magneto-resistive-sensing elements 504, 506, respectively. The strap-driver circuitry 508, set/reset-strap-driver circuitry 510, and first and second difference amplifiers 512, 514 may be deployed in the same package with the first and second magneto-resistive-sensing elements 504, 506. Alternatively, this circuitry may be monolithically formed on the same die with the first and second magneto-resistive-sensing elements 504, 506.

The compassing circuit 502 may include temperature compensation circuitry to oppose adverse temperature effects of the MR sensor. The temperature-compensation may be, for example, in the form of a thermistor, a Permalloy element, and/or active-regulation circuitry. The active regulation circuitry may sense a change, i.e., a reduction or increase in voltage or current, due to temperature effects and then provide compensation in the form of current and/or voltage in response.

The compassing circuit 502 may include other elements as well. Reference may be made to the present disclosure along with the patents and patent applications incorporated above for further details of the components of the compassing circuit 502.

FIG. 6 is a simplified circuit diagram 600 illustrating a second compassing circuit 602 integrated with the MR sensor. In this embodiment, the MR sensor may be formed from first, second and third magneto-resistive-sensing elements 604-608 that can sense three orthogonal magnetic fields. The first and second magneto-resistive sensing elements 604, 606 may be fabricated on a first die, whereas the third magneto-resistive sensing element 608 may be on a second die. While the second die may be packaged along with the first and second magneto-resistive sensing elements 604, 606, in the present embodiment, the second die is not packaged as such.

In a three-dimensional coordinate system, the first magneto-resistive-sensing element 604 may sense magnetic fields in the "X" direction, whereas the second magneto-resistive-sensing element 606 may sense magnetic fields in the "Y" direction. The third magneto-resistive-sensing element 608 may sense magnetic fields in the "Z" direction.

Like the compassing circuit 502, one or more re-orientation elements, in the form of set/reset and/or offset straps (not shown), may be formed over or otherwise integrated with the first, second and third magneto-resistive-sensing elements 604-608. The compassing circuit 602 may also be deployed with set/reset-strap-driver circuitry 610 and first, second, and third difference amplifiers 612-616. The set/reset-strap-driver circuitry 610 may effectuate set/reset sequencing of the first, second and/or third magneto-resistive-sensing elements 604-608. The first, second and third difference amplifiers 612-616 may be used to functionally adjust the outputs of the first, second and third magneto-resistive-sensing elements 604-608, respectively.

In the present embodiment, all of the set/reset-strap-driver circuitry 610 and first, second and third difference amplifiers 612-616 may be formed on the first die. The set/reset-strap-driver circuitry 610 and third difference amplifier 616, however, may be interconnected with the second die given that the third magneto-resistive sensing element 608 and the set/reset straps may be formed on the second die. Thus, set/reset pulses that are applied to the compassing circuit 602 at node 618 may pass through the first die, out a set/reset interface 620, and on to the second die in order to carry out the set/reset sequencing of the third magneto-resistive-sensing element 608. Similarly, the output signal of the third magneto-resistive-sensing element 608 that is destined for the third difference amplifier 616 may pass to the first die through a sensor interface 622.

In an alternative embodiment, some of the set/reset-strap-driver circuitry 610 and first, second and third difference amplifiers 612-616 may be formed on the first die. Other portions, for example, the set/reset-strap-driver circuitry 610 and the third difference amplifier 616 may be formed on the second die and interconnected to the first die. As one skilled in the art will recognize other combinations of the components of the compassing circuit 602 are possible.

Like the compassing circuit 502, each of the difference amplifiers 612-616 may be deployed with optional, adjustable offset and gain to beneficially compensate and/or negate undesirable changes in the magneto-resistive elements 604-608. The compassing circuit 602 may also include temperature compensation circuitry, such as described above, to oppose adverse temperature effects of the MR sensor.

Exemplary Process for Integrating Semiconductor Components with MR Sensor

Table 1, below, shows a simplified exemplary process for integrating one or more semiconductor device components, such as set/reset circuitry, with a MR sensor. It is believed that such a process is unique because, in the past, semiconductor foundries have gone to great lengths to prevent contamination of their processes with materials typically used in manufacturing magnetic sensors. In addition, companies in the magnetic industries (e.g. disk drive head manufacturers, etc.) have been separate from electronics companies, and their specialized manufacturing techniques have been kept largely separate from one another.

TABLE 1

| Sample Manufacturing Process |
|---|
| Clean Wafer |
| Oxide and Nitride diffusion, lithography, etch, clean (device-specific structuring) |
| Boron/Phosphorous implants (if any), clean (end front-end processing; begin back-end processing) |
| Deposit contact glass (if any), reflow |
| Sputter, etch, NiFe mask, lithography (device-specific structuring) |
| Dry etch metallizations, deposit and structure dielectrics (e.g. TEOS), planarizations (device-specific structuring) |
| Inspection and evaluation |

In a preferred embodiment, the semiconductor device processing is done at the front end, while the lithography and etch steps associated with making the MR sensor are done at the back end. Table 1 is intended to be generally applicable to many MR sensor manufacturing processes, and thus does not include detail on how to obtain particular architectures. The architecture shown in FIG. 2 would involve several iterations of the backend steps to obtain the multiple layers of dielectrics and metallizations. Of course, additional cleaning and other steps should be implemented as appropriate.

A device having set/reset driver circuitry integrated with a MR sensor device and exemplary processing options have been described. Because such an integrated device is manufacturable as a single chip, the user may realize advantages that include reduced size and increased functionality, among others.

In the foregoing detailed description, numerous specific details are set forth in order to provide a thorough understanding of exemplary embodiments described herein. However, it will be understood that these embodiments may be practiced without the specific details. In other instances, well-known methods, procedures, components and circuits have not been described in detail, so as not to obscure the following description.

Further, the embodiments disclosed are for exemplary purposes only and other embodiments may be employed in lieu of or in combination with of the embodiments disclosed. Moreover, it is contemplated that the above-described apparatus and components may be fabricated using Silicon/Gallium Arsenide (Si/GaAs), Silicon/Germanium (SiGe), and/or Silicon/Carbide (SiC) fabricating techniques in addition to the above-described techniques. Included amongst these techniques are Heterojunction Bipolar Transistor (HBT) fabrication processes, and/or Metal Semiconductor Field Effect Transistor (MESFET) fabrication processes.

The exemplary embodiments described herein may be deployed in various equipment and other devices, which may include or be utilized with any appropriate voltage source, such as a battery, an alternator and the like, providing any appropriate voltage, such as about 0.4, 5, 10, 12, 24 and 48 Volts DC, and about 24, and 120 Volts AC and the like.

Exemplary embodiments have been illustrated and described. Further, the claims should not be read as limited to the described order or elements unless stated to that effect. In addition, use of the term "means" in any claim is intended to invoke 35 U.S.C. §112, 6, and any claim without the word "means" is not so intended.

We claim:

1. A sensing apparatus comprising: at least one magneto-resistive-sensing element; at least one reorientation element for adjusting the at least one magneto-resistive-sensing element; and semiconductor circuitry having driver circuitry for controlling the at least one reorientation element, wherein the at least one magneto-resistive-sensing element, the at least one reorientation element, and the semiconductor circuitry are disposed in a single package, and wherein at least a portion of the semiconductor circuitry and the at least one magneto-resistive-sensing element is monolithically formed on a first chip, wherein at least a portion of the semiconductor circuitry is formed on a second chip.

2. The sensing apparatus of claim 1, wherein the first and second chips are electrically connected together.

3. The sensing apparatus of claim 1, wherein the first chip is placed orthogonal to the second chip.

4. The sensing apparatus of claim 1, wherein the second chip is placed in close proximity to the first chip.

5. The sensing apparatus of claim 4, wherein the first and second chips are electrically connected together.

6. The sensing apparatus of claim 4, wherein the first and second chips have no intentional electrical interaction.

7. The sensing apparatus of claim 1, wherein a first magneto-resistive-sensing element and a first portion of the semiconductor circuitry are formed on the first chip, and a second magneto-resistive-sensing element and a second portion of the semiconductor circuitry are formed on the second chip.

8. The sensing apparatus of claim 7, wherein the first portion of the semiconductor circuitry includes driver circuitry for controlling a first reorientation element for adjusting the first magneto-resistive-sensing element, and the second portion of the semiconductor circuitry includes driver circuitry for controlling a second reorientation element for adjusting the second magneto-resistive-sensing element.

9. The sensing apparatus of claim 7, wherein at least one amplifier is included in at least one of the first and second portions of the semiconductor circuitry.

10. The sensing apparatus of claim 1, wherein the driver circuitry comprises any of functional adjust, signal conditioning, and electro-static-discharge protection circuitry.

11. The sensing apparatus of claim 1, wherein the semiconductor circuitry further comprises position-sensing circuitry.

12. The sensing apparatus of claim 11, wherein in the at least one magneto-resistive-sensing element provides an output signal proportional to a sensed magnetic field, and wherein the position-sensing circuitry comprises at least one amplifier coupled the output signal.

13. The sensing apparatus of claim 1, wherein the semiconductor circuitry further comprises temperature-compensation circuitry.

14. A sensing apparatus comprising:
at least one magneto-resistive-sensing element;
at least one reorientation element for adjusting the at least one magneto-resistive-sensing element; and
semiconductor circuitry having driver circuitry for controlling the at least one reorientation element,
wherein the at least one magneto-resistive-sensing element, the at least one reorientation element, and the semiconductor circuitry are disposed in a single package,
wherein at least a portion of the semiconductor circuitry and the at least one magneto-resistive-sensing element is monolithically formed on a first chip,
wherein the at least one magneto-resistive-sensing element comprises first and second magneto-resistive-sensing elements,
wherein the at least one reorientation element comprises first and second reorientation elements for adjusting the first and second magneto-resistive-sensing elements, respectively,
wherein the driver circuitry comprises driver circuitry for controlling the first and second reorientation elements,
wherein the first and second magneto-resistive-sensing elements detect magnetic fields in orthogonal planes and provide respective first and second output signals proportional to the detected magnetic fields, and
wherein the semiconductor circuitry comprises compassing circuitry coupled to the first and second output signals to provide a compassing output responsive to the first and second output signals.

15. The sensing apparatus of claim 14, wherein the compassing circuitry comprises at least two amplifiers, wherein a one of the at least two amplifiers is coupled the first output signal and another of the least two amplifiers is coupled to the second output signal.

* * * * *

UNITED STATES PATENT AND TRADEMARK OFFICE
CERTIFICATE OF CORRECTION

| | | |
|---|---|---|
| PATENT NO. | : 7,449,882 B2 | Page 1 of 1 |
| APPLICATION NO. | : 11/782455 | |
| DATED | : November 11, 2008 | |
| INVENTOR(S) | : Witcraft et al. | |

It is certified that error appears in the above-identified patent and that said Letters Patent is hereby corrected as shown below:

On the title page, item 63 Related U.S. Application Data please insert: --which claims benefit of 60/475,175 filed on June 2, 2003 and claims benefit of 60/475,191 filed on June 2, 2003 and claims benefit of 60/462,872 filed on April 15, 2003.--

Signed and Sealed this
Twenty-seventh Day of September, 2011

David J. Kappos
*Director of the United States Patent and Trademark Office*